(12) United States Patent
Park et al.

(10) Patent No.: US 8,193,036 B2
(45) Date of Patent: Jun. 5, 2012

(54) SEMICONDUCTOR DEVICE AND METHOD OF FORMING MOLD UNDERFILL USING DISPENSING NEEDLE HAVING SAME WIDTH AS SEMICONDUCTOR DIE

(75) Inventors: SooMoon Park, Kyonggi-do (KR); ByoungWook Jang, Kyonggi-do (KR); DongSoo Moon, Kyonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 53 days.

(21) Appl. No.: 12/882,083

(22) Filed: Sep. 14, 2010

(65) Prior Publication Data

US 2012/0061858 A1    Mar. 15, 2012

(51) Int. Cl.
*H01L 21/00*    (2006.01)

(52) U.S. Cl. ............... 438/108; 257/E21.503; 257/778; 257/780; 438/118; 438/119

(58) Field of Classification Search ........... 257/E21.503, 257/E21.511, E21.499, E21.705, E23.001, 257/725, 728, 737, 778, 780, 787; 438/106–127
See application file for complete search history.

(56) References Cited

U.S. PATENT DOCUMENTS

| 6,126,428 | A * | 10/2000 | Mitchell et al. | 425/110 |
| 6,214,635 | B1 * | 4/2001 | Akram et al. | 438/51 |
| 6,391,683 | B1 * | 5/2002 | Chiu et al. | 438/108 |
| 6,498,054 | B1 | 12/2002 | Chiu et al. | |
| 6,600,232 | B2 * | 7/2003 | Chiu et al. | 257/778 |
| 6,610,559 | B2 * | 8/2003 | Wang et al. | 438/108 |
| 7,141,452 | B2 * | 11/2006 | Sambasivam et al. | 438/118 |
| 7,510,108 | B2 * | 3/2009 | Lawlyes et al. | 228/179.1 |
| 7,700,414 | B1 * | 4/2010 | San Antonio et al. | 438/118 |
| 7,838,336 | B2 * | 11/2010 | Bartley et al. | 438/109 |
| 2003/0096453 | A1 * | 5/2003 | Wang et al. | 438/108 |
| 2004/0262751 | A1 * | 12/2004 | Lamola et al. | 257/734 |
| 2008/0211111 | A1 * | 9/2008 | Park et al. | 257/778 |
| 2009/0302437 | A1 * | 12/2009 | Kim et al. | 257/659 |

* cited by examiner

*Primary Examiner* — Chris Chu
(74) *Attorney, Agent, or Firm* — Robert D. Atkins; Patent Law Group: Atkins & Associates, P.C.

(57) ABSTRACT

A semiconductor device has a semiconductor die mounted over a surface of a substrate. A mold underfill dispensing needle has a width substantially equal to a width of the semiconductor die. The dispensing needle is placed in fluid communication with a side of the semiconductor die. A mold underfill is deposited from an outlet of the dispensing needle evenly across a width of the semiconductor die into an area between the semiconductor die and substrate without motion of the dispensing needle. The dispensing needle has a shank and the outlet in a T-configuration. The dispensing needle can have a plurality of pole portions between a shank and the outlet. The dispensing needle has a plate between a shank and the outlet. The outlet has an upper edge with a length substantially equal to or greater than a length of a lower edge of the outlet.

20 Claims, 9 Drawing Sheets

SEMICONDUCTOR DEVICE AND METHOD OF FORMING MOLD UNDERFILL USING DISPENSING NEEDLE HAVING SAME WIDTH AS SEMICONDUCTOR DIE

FIELD OF THE INVENTION

The present invention relates in general to semiconductor devices and, more particularly, to a semiconductor device and method of forming a mold underfill using a dispensing needle having the same width as a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

A semiconductor die is commonly mounted over a substrate with an encapsulant deposited between the semiconductor die and substrate, as shown in FIG. 1a. A dispensing needle 10 pushes encapsulant 12 into area 14 between semiconductor die 16 and substrate 18. Dispensing needle 10 moves back and forth between reference point 20 and reference point 22 across a width of semiconductor die 16 while injecting encapsulant 12 into area 14, as shown in FIG. 1b. Dispensing needle 10 stops at each reference point before returning to the opposite reference point. In some embodiments, the flow of encapsulant 12 is momentarily shut off at each change of direction of dispensing needle 10. Encapsulant 12 is known to build up unevenly in area 14 due to the start and stop and intermediate motion of dispensing needle 10. For example, encapsulant 12a is deposited into area 14 during a pass of dispensing needle from reference point 20 to reference point 22. Encapsulant 12b is deposited into area 14 during the return pass of dispensing needle from reference point 22 to reference point 20. The transitional dispensing motion takes considerable time to complete and can cause encapsulant bleed-out and form voids in encapsulant 12 due to discontinuous and uneven flow.

SUMMARY OF THE INVENTION

A need exists to evenly deposit mold underfill between a semiconductor die and substrate without forming voids or inducing underfill bleed-out from the semiconductor die. Accordingly, in one embodiment, the present invention is a method of making a semiconductor device comprising the steps of providing a substrate and semiconductor die, mounting the semiconductor die over a surface of the substrate, providing a mold underfill dispensing needle having a width substantially equal to a width of the semiconductor die, placing the mold underfill dispensing needle in fluid communication with a side of the semiconductor die, and depositing a mold underfill from an outlet of the dispensing needle evenly across a width of the semiconductor die into an area between the semiconductor die and substrate without motion of the dispensing needle.

In another embodiment, the present invention is a method of making a semiconductor device comprising the steps of mounting a semiconductor die over a substrate, providing a dispensing needle disposed across a width of the semiconductor die, disposing the dispensing needle in fluid communication with a side of the semiconductor die, and depositing a mold underfill from an outlet of the dispensing needle into an area between the semiconductor die and substrate.

In another embodiment, the present invention is a method of making a semiconductor device comprising the steps of mounting a semiconductor die over a substrate, providing a dispensing needle, disposing the dispensing needle in fluid communication with a side of the semiconductor die, and depositing a mold underfill from an outlet of the dispensing needle into an area between the semiconductor die and substrate without motion of the dispensing needle.

In another embodiment, the present invention is a semiconductor device comprising a substrate and semiconductor die mounted over the substrate. A dispensing needle has a width substantially equal to a width of the semiconductor die. A mold underfill is deposited from an outlet of the dispensing needle into an area between the semiconductor die and substrate without motion of the dispensing needle.

DETAILED DESCRIPTION OF THE DRAWINGS

Figure 1A:
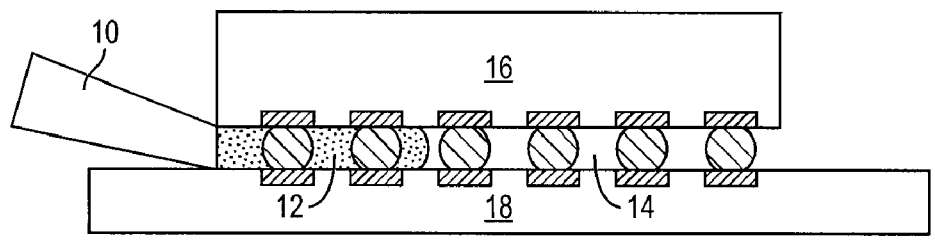
FIGS. 1a-1b show a conventional mold underfill using a movable dispensing needle.
Figure 1B:
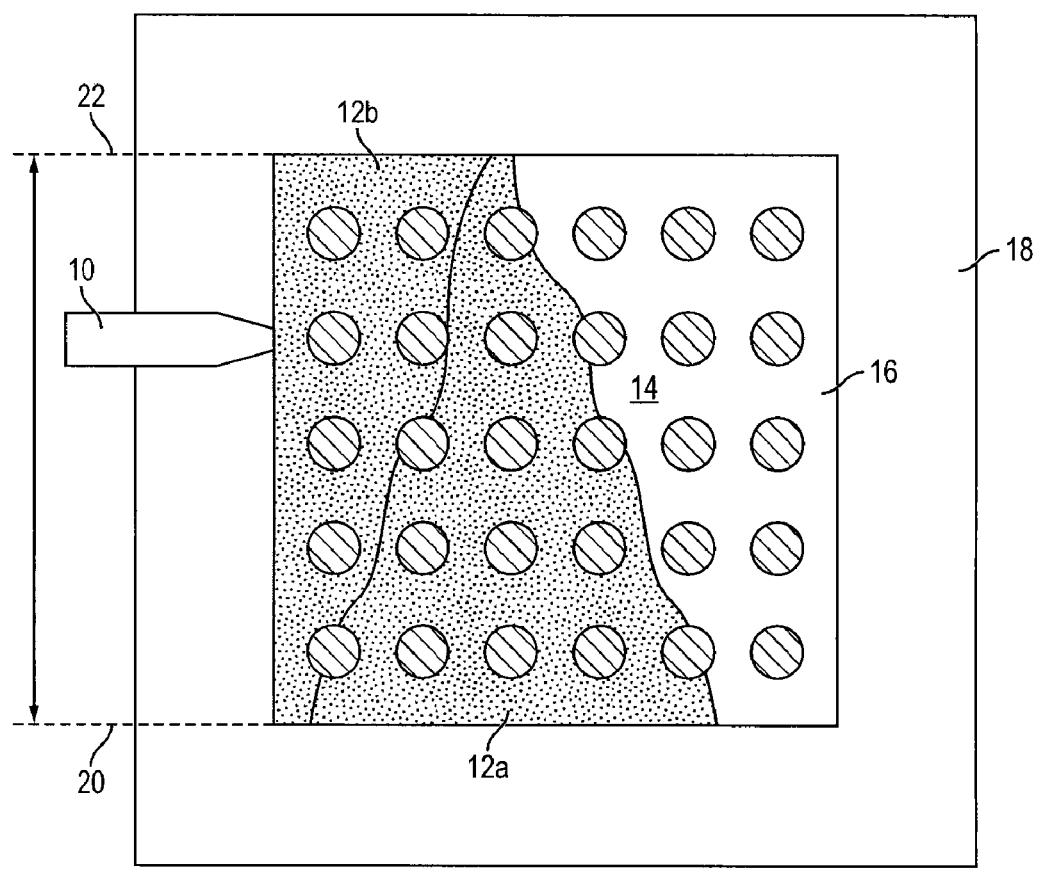

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted over a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
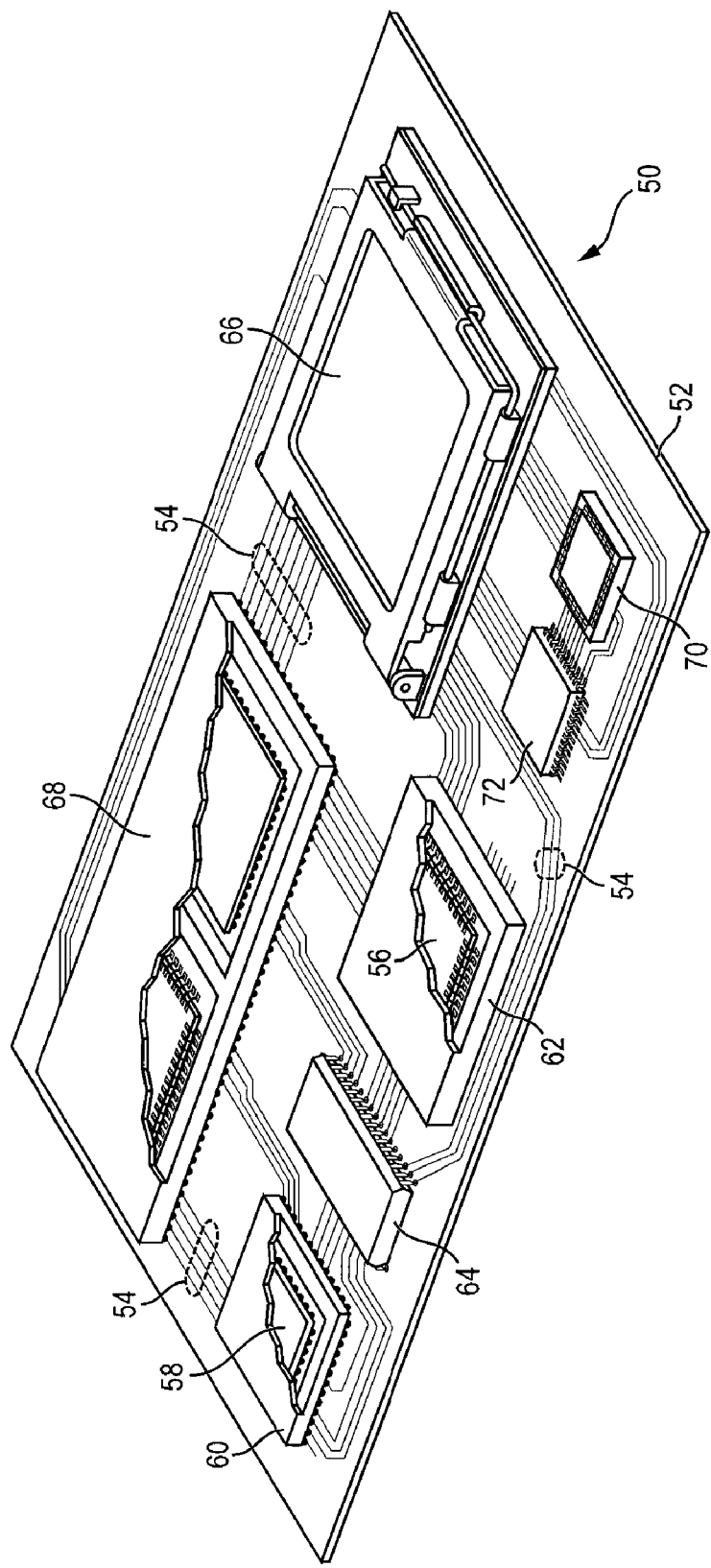
FIG. 2 illustrates a PCB with different types of packages mounted over its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
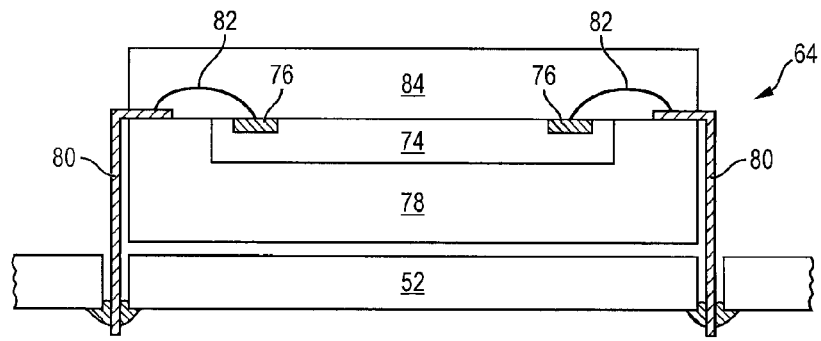
FIGS. 3a-3c illustrate further detail of the representative semiconductor packages mounted over the PCB.
Figure 3B:
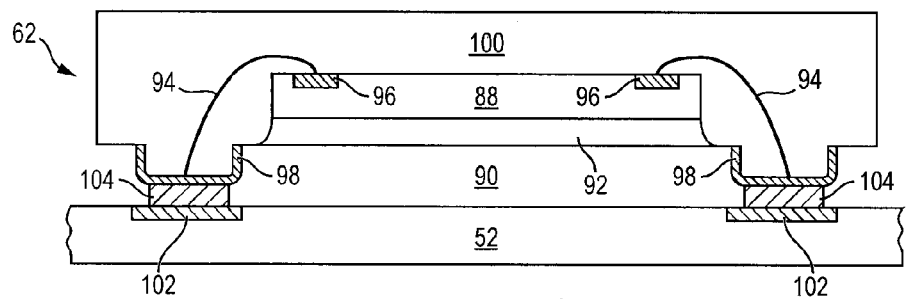
Figure 3C:
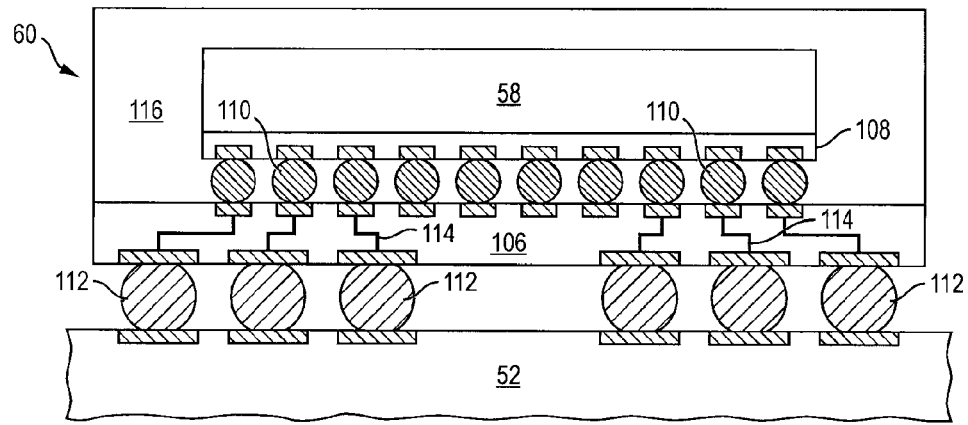

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted over an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
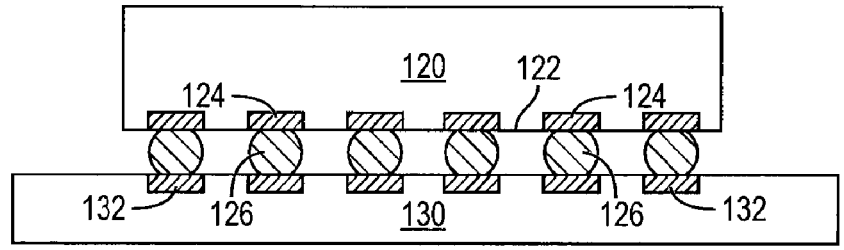
FIGS. 4a-4f illustrate a process of forming a mold underfill using a T-shaped dispensing needle having the same width as a semiconductor die.

FIGS. 4a-4f illustrate, in relation to FIGS. 2 and 3a-3c, a mold underfill using a dispensing needle having the same width as a semiconductor die. FIG. 4a shows semiconductor die 120 with an active surface 122 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 122 to implement analog circuits or digital circuits, such as digital signal processor (DSP), ASIC, memory, or other signal processing circuit. Semiconductor die 120 may also contain integrated passive devices (IPDs), such as inductors, capacitors, and resistors, for RF signal processing. Contact pads 124 are formed on active surface 122 and electrically connected to the circuits on the active surface. Bumps 126 are formed on contact pads 124. In one embodiment, semiconductor die 120 is a flipchip type semiconductor die. Semiconductor die 120 is mounted over substrate 130 with bumps 126 metallurgically and electrically connected to contact pads 132 by reflow and/or pressure.

Figure 4B:
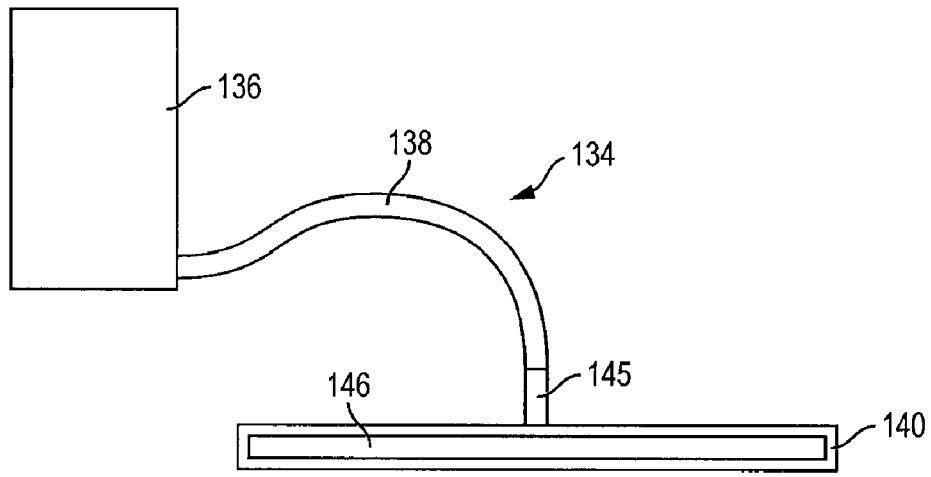

FIG. 4b shows an underfill dispenser 134 including a mold underfill reservoir 136, connecting tube 138, and dispensing needle 140. Dispensing needle 140 has a T-shaped shank 145 and outlet 146 with a width substantially equal to a width of semiconductor die 120 +/−10% tolerance. Accordingly, a particular width dispensing needle 140 is matched or dedicated for use with a given width semiconductor die 120. The proper dispensing needle 140 is attached to connecting tube 138 according to the width of semiconductor die 120 to be mold underfilled.

Figure 4C:
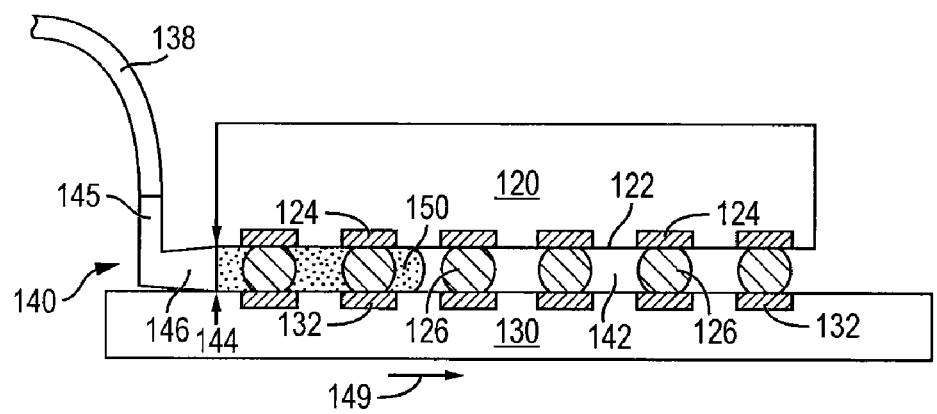
Figure 4D:
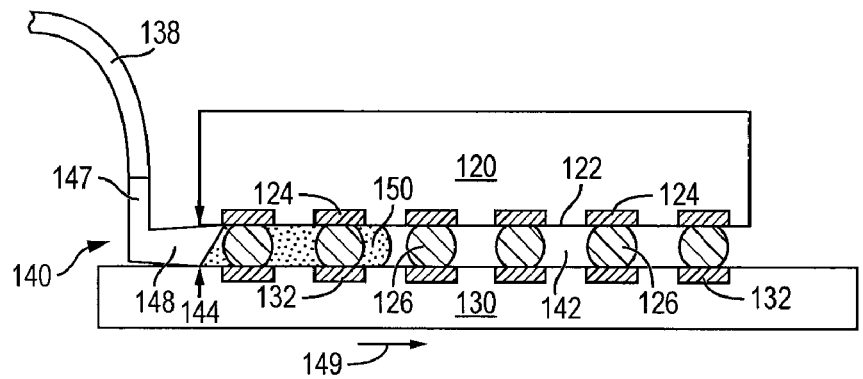

In FIG. 4c, dispensing needle 140 is placed in fluid communication with area 142 between semiconductor die 120 and substrate 130. More specifically, outlet 146 of dispensing needle 140 is placed adjacent to one side of gap 144 between semiconductor die 120 and substrate 130. The outlet 146 has equal length upper edge and lower edge. Alternatively, dispensing needle 140 has a shank 147 and outlet 148 with longer upper edge and shorter lower edge, as shown in FIG. 4d.

A mold underfill (MUF) or encapsulant material 150 is pumped from reservoir 136 through connecting tube 138 for dispensing from needle 140. Connecting tube 138 has sufficient diameter for a continuous flow of MUF 150 from reservoir 136 to dispensing needle 140. MUF 150 is injected under pressure from outlet 146 or outlet 148 of dispensing needle 140 uniformly and evenly across the entire width of semiconductor die 120 in the direction of arrow 149 into area 142 between the semiconductor die and substrate 130 around bumps 126. MUF 150 can be polymer composite material, such as epoxy resin with filler, epoxy acrylate with filler, or polymer with proper filler. MUF 150 is non-conductive and environmentally protects the semiconductor device from external elements and contaminants.

Figure 4E:
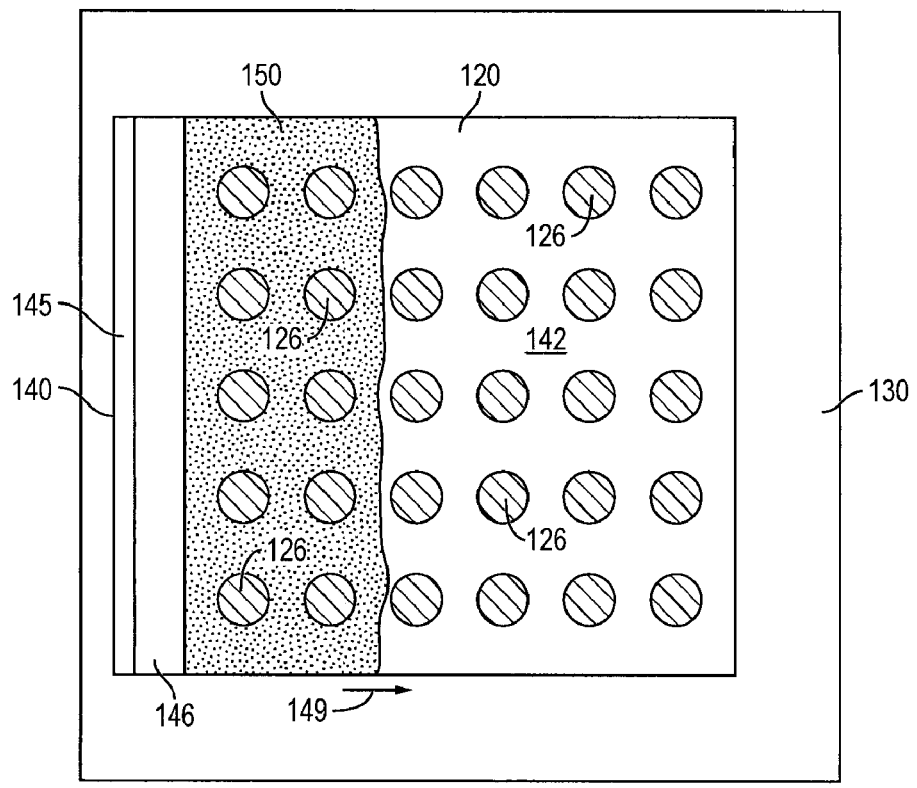
Figure 4F:
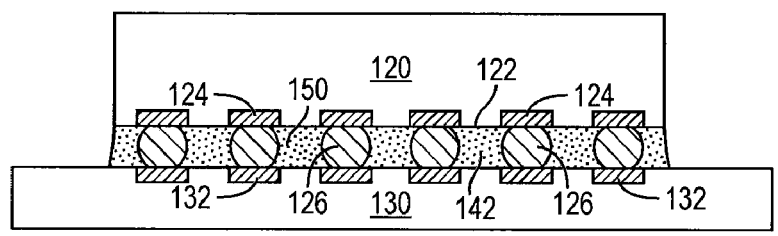

FIG. 4e shows a plan view of MUF 150 filling area 142 in the direction of arrow 149 between semiconductor die 120 and substrate 130 around bumps 126. Dispensing needle 140 pushes MUF 150 into area 142 under pressure for a complete and uniform coverage through area 142. Since needle 140 has a width substantially equal to the width of semiconductor die 120, the needle simultaneously and uniformly dispenses MUF 150 evenly across the entire width of area 142. That is, needle 140 remains stationary during mold underfill, i.e., there is no need to move the needle during the dispensing process. The stationary state of dispensing needle 140 reduces void formation. The die-width dispensing needle 140 reduces bleed-out of excess MUF 150 from area 142. FIG. 4f shows MUF 150 deposited in area 142 between semiconductor die 120 and substrate 130 without forming voids.

Figure 5A:
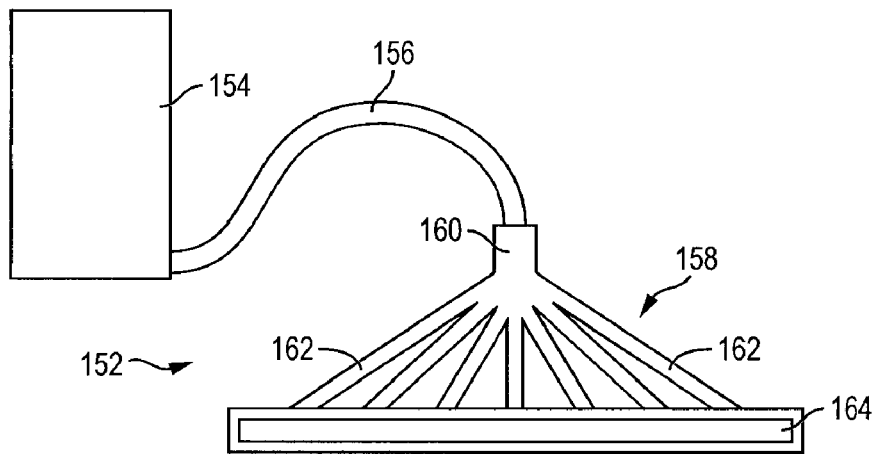
FIGS. 5a-5e illustrate a process of forming a mold underfill using a pole-configured dispensing needle having the same width as the semiconductor die.

FIG. 5a shows another embodiment of underfill dispenser 152, continuing from FIG. 4a, including a mold underfill reservoir 154, connecting tube 156, and dispensing needle 158. Dispensing needle 158 has a shank 160 for connecting to tube 156, plurality of separate pole sections 162, and outlet 164 with a width substantially equal to a width of semiconductor die 120 +/−10% tolerance. Accordingly, a particular width dispensing needle 158 is matched or dedicated for use with a given width semiconductor die 120. The proper dispensing needle 158 is attached to connecting tube 156 according to the width of semiconductor die 120 to be mold underfilled.

Figure 5B:
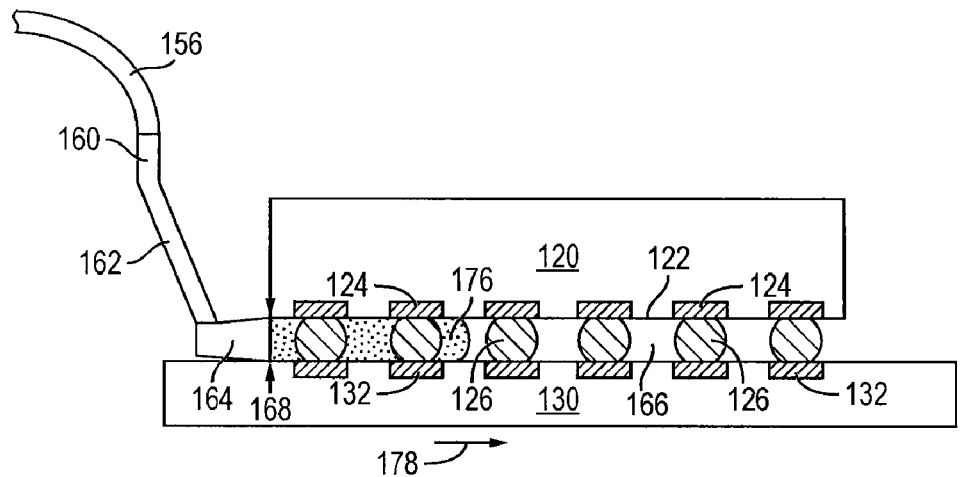
Figure 5C:
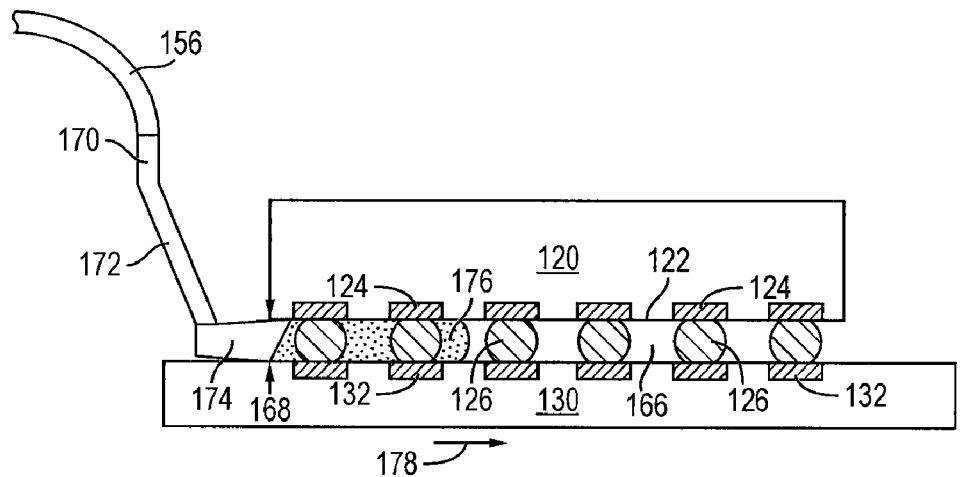

In FIG. 5b, dispensing needle 158 is placed in fluid communication with area 166 between semiconductor die 120 and substrate 130. More specifically, outlet 164 of dispensing needle 158 is placed adjacent to one side of gap 168 between semiconductor die 120 and substrate 130. The outlet 164 has equal length upper edge and lower edge. Alternatively, dispensing needle 158 has a shank 170, poles 172, and outlet 174 with longer upper edge and shorter lower edge, as shown in FIG. 5c.

A MUF or encapsulant material 176 is pumped from reservoir 154 through connecting tube 156 for dispensing from needle 158. Connecting tube 156 has sufficient diameter for a continuous flow of MUF 176 from reservoir 154 to dispensing needle 158. MUF 176 is injected under pressure from outlet 164 or outlet 174 of dispensing needle 158 uniformly and evenly across the entire width of semiconductor die 120 in the direction of arrow 178 into area 166 between the semiconductor die and substrate 130 around bumps 126. MUF 176 can be polymer composite material, such as epoxy resin with filler, epoxy acrylate with filler, or polymer with proper filler. MUF 176 is non-conductive and environmentally protects the semiconductor device from external elements and contaminants.

Figure 5D:
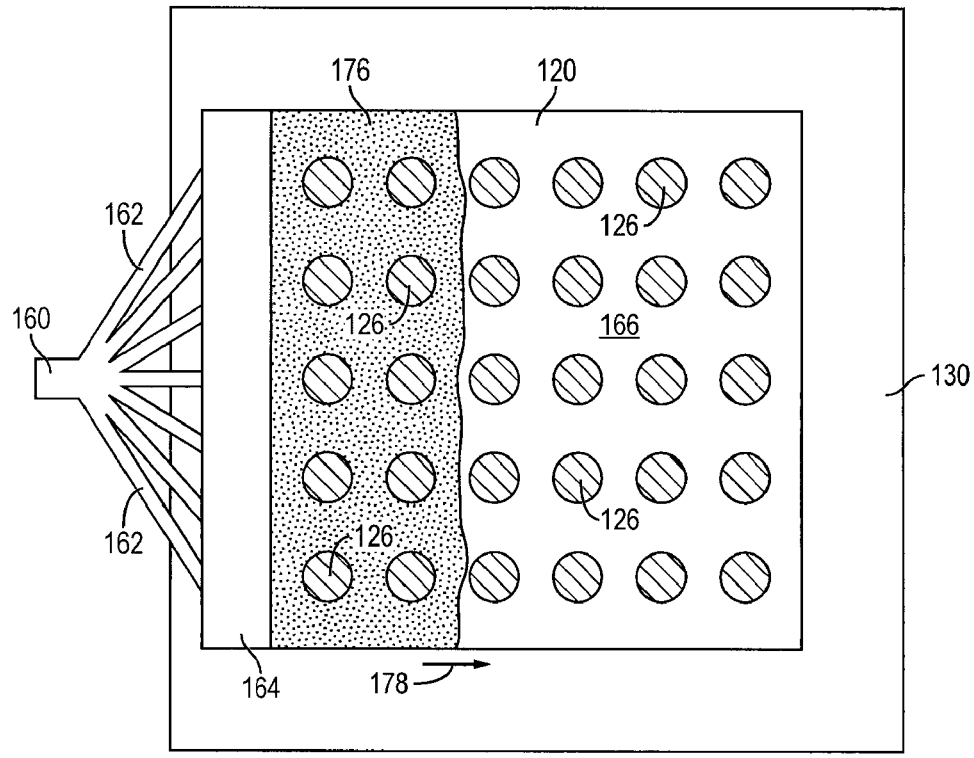
Figure 5E:
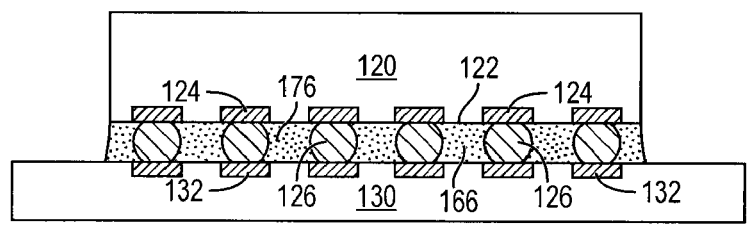

FIG. 5d shows a plan view of MUF 176 filling area 166 in the direction of arrow 178 between semiconductor die 120 and substrate 130 around bumps 126. Dispensing needle 158 pushes MUF 176 into area 166 under pressure for a complete and uniform coverage through area 166. Since needle 158 has a width substantially equal to the width of semiconductor die 120, the needle simultaneously and uniformly dispenses MUF 176 evenly across the entire width of area 166. That is, needle 158 remains stationary during mold underfill, i.e., there is no need to move the needle during the dispensing process. The stationary state of dispensing needle 158 reduces void formation. The die-width dispensing needle 158 reduces bleed-out of excess MUF 176 from area 166. FIG. 5e shows MUF 176 deposited in area 166 between semiconductor die 120 and substrate 130 without forming voids.

Figure 6A:
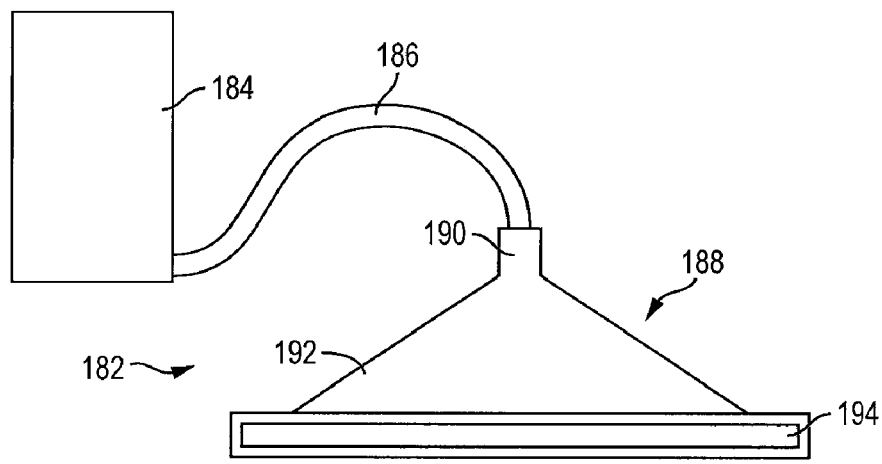
FIGS. 6a-6e illustrate a process of forming a mold underfill using a plate-configured dispensing needle having the same width as the semiconductor die.

FIG. 6a shows another embodiment of underfill dispenser 182, continuing from FIG. 4a, including a mold underfill reservoir 184, connecting tube 186, and dispensing needle 188. Dispensing needle 188 has a shank 190 for connecting to tube 186, plate 192, and outlet 194 with a width substantially equal to a width of semiconductor die 120 +/−10% tolerance. Accordingly, a particular width dispensing needle 188 is matched or dedicated for use with a given width semiconductor die 120. The proper dispensing needle 188 is attached to connecting tube 186 according to the width of semiconductor die 120 to be mold underfilled.

Figure 6B:
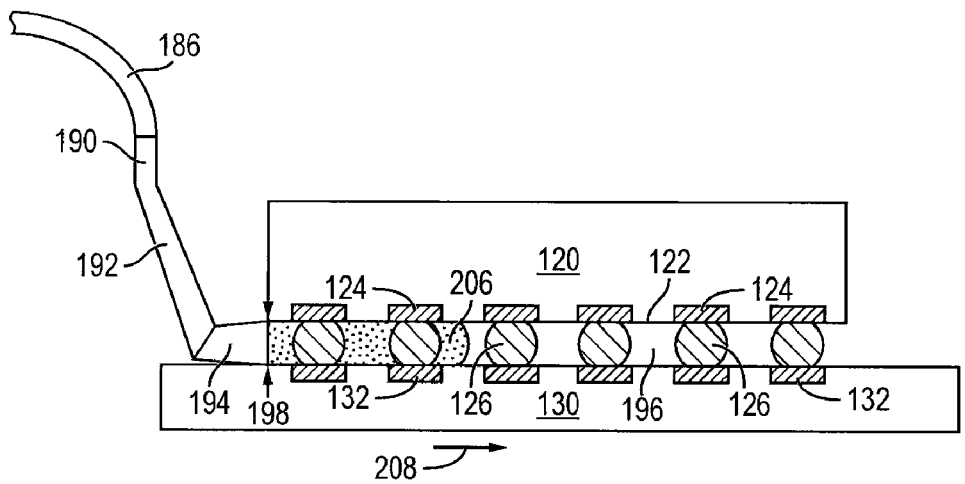
Figure 6C:
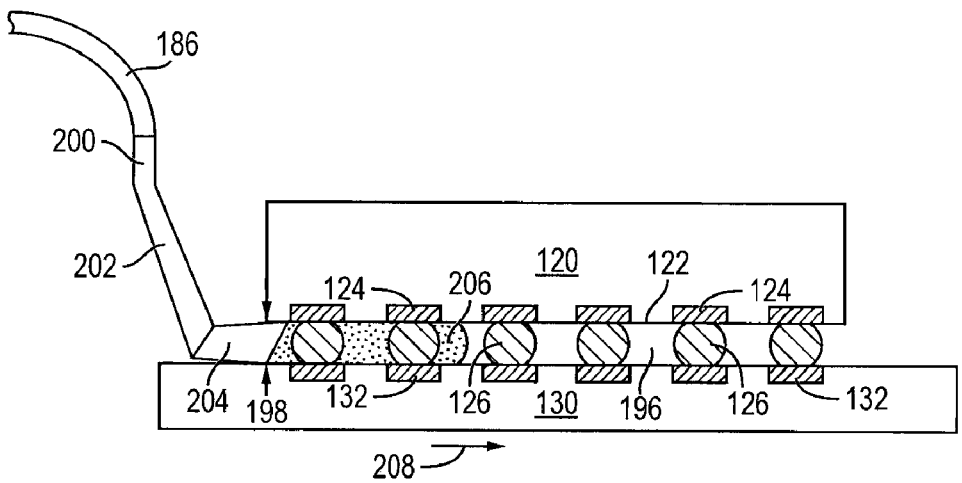

In FIG. 6b, dispensing needle 188 is placed in fluid communication with area 196 between semiconductor die 120 and substrate 130. More specifically, outlet 194 of dispensing needle 158 is placed adjacent to one side of gap 198 between semiconductor die 120 and substrate 130. The outlet 194 has equal length upper edge and lower edge. Alternatively, dispensing needle 188 has a shank 200, plate 202, and outlet 204 with longer upper edge and shorter lower edge, as shown in FIG. 6c.

A MUF or encapsulant material 206 is pumped from reservoir 184 through connecting tube 186 for dispensing from needle 188. Connecting tube 186 has sufficient diameter for a continuous flow of MUF 206 from reservoir 184 to dispensing needle 188. MUF 206 is injected under pressure from outlet 194 or outlet 204 of dispensing needle 188 uniformly and evenly across the entire width of semiconductor die 120 in the direction of arrow 208 into area 196 between the semiconductor die and substrate 130 around bumps 126. MUF 206 can be polymer composite material, such as epoxy resin with filler, epoxy acrylate with filler, or polymer with proper filler. MUF 206 is non-conductive and environmentally protects the semiconductor device from external elements and contaminants.

Figure 6D:
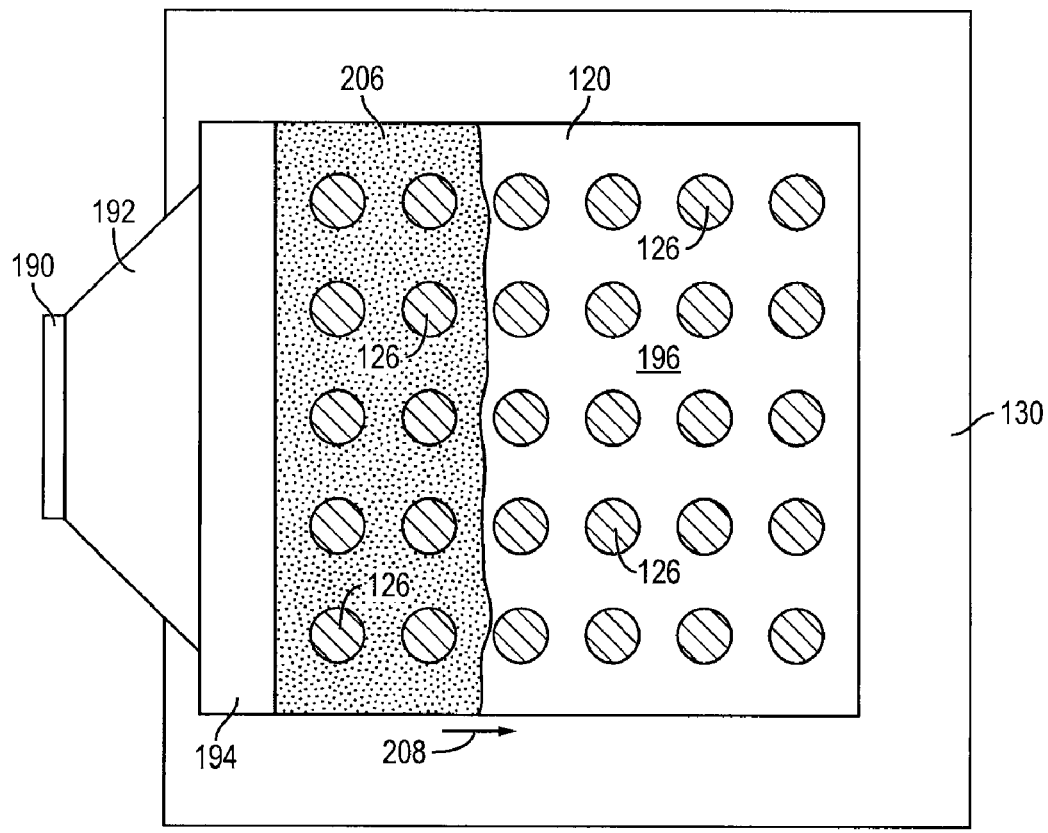
Figure 6E:
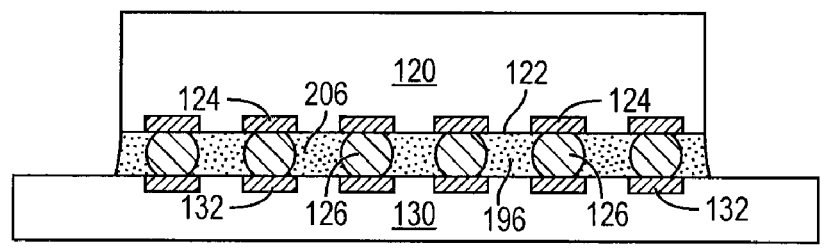

FIG. 6d shows a plan view of MUF 206 filling area 196 in the direction of arrow 208 between semiconductor die 120 and substrate 130 around bumps 126. Dispensing needle 188 pushes MUF 206 into area 196 under pressure for a complete and uniform coverage through area 196. Since needle 188 has a width substantially equal to the width of semiconductor die 120, the needle simultaneously and uniformly dispenses MUF 206 evenly across the entire width of area 196. That is, needle 188 remains stationary during mold underfill, i.e., there is no need to move the needle during the dispensing process. The stationary state of dispensing needle 188 reduces void formation. The die-width dispensing needle 188 reduces bleed-out of excess MUF 206 from area 196. FIG. 6e shows MUF 206 deposited in area 196 between semiconductor die 120 and substrate 130 without forming voids.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    providing a semiconductor die;
    mounting the semiconductor die over a surface of the substrate;
    providing a mold underfill dispensing needle having a width substantially equal to a width of the semiconductor die;
    placing the mold underfill dispensing needle in fluid communication with a side of the semiconductor die; and
    depositing a mold underfill from an outlet of the dispensing needle evenly across a width of the semiconductor die into an area between the semiconductor die and substrate without motion of the dispensing needle.

2. The method of claim 1, further including providing the dispensing needle with a shank and the outlet in a T-configuration.

3. The method of claim 1, further including providing the dispensing needle with a plurality of pole portions between a shank and the outlet.

4. The method of claim 1, further including providing the dispensing needle with a plate between a shank and the outlet.

5. The method of claim 1, wherein the outlet includes a first edge having a length substantially equal to a length of a second edge of the outlet.

6. The method of claim 1, wherein the outlet includes a first edge having a length greater than a length of a second edge of the outlet.

7. A method of making a semiconductor device, comprising:
    mounting a semiconductor die over a substrate;
    providing a dispensing needle disposed across a width of the semiconductor die;
    disposing the dispensing needle in fluid communication with a side of the semiconductor die; and
    depositing a mold underfill from an outlet of the dispensing needle into an area between the semiconductor die and substrate.

8. The method of claim 7, further including providing the dispensing needle with a shank and the outlet in a T-configuration.

9. The method of claim 7, further including providing the dispensing needle with a plurality of pole portions between a shank and the outlet.

10. The method of claim 7, further including providing the dispensing needle with a plate between a shank and the outlet.

11. The method of claim 7, wherein the outlet includes a first edge having a length substantially equal to a length of a second edge of the outlet.

12. The method of claim 7, wherein the outlet includes a first edge having a length greater than a length of a second edge of the outlet.

13. The method of claim 7, further including changing the dispensing needle to match a width of the semiconductor die.

14. A method of making a semiconductor device, comprising:
    mounting a semiconductor die over a substrate;
    providing a dispensing needle;
    disposing the dispensing needle in fluid communication with a side of the semiconductor die; and
    depositing a mold underfill from an outlet of the dispensing needle into an area between the semiconductor die and substrate without motion of the dispensing needle.

15. The method of claim 14, wherein the dispensing needle has a width substantially equal to a width of the semiconductor die.

16. The method of claim 14, further including providing the dispensing needle with a shank and the outlet in a T-configuration.

17. The method of claim 14, further including providing the dispensing needle with a plurality of pole portions between a shank and the outlet.

18. The method of claim 14, further including providing the dispensing needle with a plate between a shank and the outlet.

19. The method of claim 14, wherein the outlet includes a first edge having a length substantially equal to a length of a second edge of the outlet.

20. The method of claim 14, wherein the outlet includes a first edge having a length greater than a length of a second edge of the outlet.

* * * * *